United States Patent
Freidhof

(10) Patent No.: US 9,250,268 B2
(45) Date of Patent: Feb. 2, 2016

(54) MEASURING DEVICE HAVING A TRIGGER UNIT

(75) Inventor: Markus Freidhof, Kirchseeon (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 540 days.

(21) Appl. No.: 13/806,829

(22) PCT Filed: Jun. 3, 2011

(86) PCT No.: PCT/EP2011/059191
§ 371 (c)(1),
(2), (4) Date: Dec. 24, 2012

(87) PCT Pub. No.: WO2011/160935
PCT Pub. Date: Dec. 29, 2011

(65) Prior Publication Data
US 2013/0099827 A1    Apr. 25, 2013

(30) Foreign Application Priority Data

Jun. 23, 2010 (DE) .......................... 10 2010 024 708
Sep. 21, 2010 (DE) .......................... 10 2010 046 098

(51) Int. Cl.
*G01R 13/32* (2006.01)
*G01R 29/26* (2006.01)
*G06F 19/00* (2011.01)
*G01R 13/02* (2006.01)

(52) U.S. Cl.
CPC ............ *G01R 13/32* (2013.01); *G01R 13/0254* (2013.01); *G01R 29/26* (2013.01)

(58) Field of Classification Search
CPC .... G01R 13/0254; G01R 13/32; G01R 29/26; G06F 3/0418

USPC ............ 702/108, 124, 111; 315/246; 327/73, 327/90; 375/223, 303; 715/866
See application file for complete search history.

(56) References Cited

U.S. PATENT DOCUMENTS

| 5,404,054 A * | 4/1995 | Kotowski .................... 327/73 |
| 2007/0282542 A1 | 12/2007 | Duff et al. |
| 2009/0222771 A1 | 9/2009 | Eibl |

FOREIGN PATENT DOCUMENTS

| DE | 3936932 A1 | 5/1990 |
| DE | 10 2006 027 835 A1 | 1/2007 |

(Continued)

OTHER PUBLICATIONS

Chen, "Common-Mode Ripple Current Estimator for Parallel Three-Phase Inverters",pp. 1330-1339, vol. 24, No. 5, May 1, 2009, IEEE Transactions on Power Electronics.

(Continued)

*Primary Examiner* — John H Le
(74) *Attorney, Agent, or Firm* — Ditthavong & Steiner, P.C.

(57) ABSTRACT

A measuring device for triggering a test signal with a superposed noise signal includes a trigger unit, which is connected to a recording unit, where the test signal with respectively superposed noise signal is supplied to both. The trigger unit outputs a trigger signal to the recording unit as soon as the test signal with superposed noise signal has completely run through a hysteresis range. The trigger unit is connected to a hysteresis adjustment unit, where the hysteresis adjustment unit specifies a hysteresis range to the trigger unit, and where the hysteresis range specified by the hysteresis adjustment unit is adjustable.

20 Claims, 5 Drawing Sheets

(56) References Cited

FOREIGN PATENT DOCUMENTS

| DE | 10 2005 035 473 A1 | 2/2007 |
| DE | 10 2008 017 289 A1 | 9/2009 |
| EP | 0 663 597 A2 | 7/1995 |
| EP | 0 740 161 A2 | 10/1996 |
| EP | 1 672 794 A2 | 6/2006 |

OTHER PUBLICATIONS

International Search Report for PCT/EP2011/059191 dated Aug. 9, 2011.

Joachim Bitzer Digitaltechnik, "Windows Software fur Tiepie Oszilloskopprodukte", No. 2, Jan. 2009, pp. 1-117.

* cited by examiner

MEASURING DEVICE HAVING A TRIGGER UNIT

CROSS-REFERENCE TO RELATED APPLICATION

The present application is a national phase application of PCT Application No. PCT/EP2011/059191, filed on Jun. 3, 2011, and claims priority to German Application No. 10 2010 024 708.1, filed on Jun. 23, 2010, and German Application No. 10 2010 046 098.2, filed on Sep. 21, 2010, the entire contents of which are herein incorporated by reference.

BACKGROUND OF THE INVENTION

1. Field of the Invention

The present invention relates to a measuring device for the digital triggering of a test signal with superposed noise signals and can be used in a recording device, for example, in a digital oscilloscope.

2. Discussion of the Background

A phase-corrected or time-corrected display of a test signal on a recording device, for example, a digital oscilloscope, requires a triggering, which identifies the signal portion of the test signal to be displayed on the recording device, for example, via a trigger threshold value, and initiates the recording of the test signal on the recording device via a trigger signal derived from it at the trigger time.

However, interference which is superposed as noise on the signal to be measured can be problematic. As illustrated in FIG. 2, such interference can cause the triggering of an oscilloscope to be released in error. In FIG. 2, a trigger is to be released on a rising signal edge; however, the trigger is also released in the case of a falling edge of the signal to be measured, because interference with a rising edge is superposed on the signal to be measured at the level of the trigger threshold. With a continuous triggering, so-called shadows appear because, as a result of the error triggering events, the test signal to be displayed is not fixed in its position. These shadows have an interfering influence for the user who wishes to evaluate the test signal; or respectively, an automated evaluation of the test data is made significantly more difficult in the case of an error triggering (erroneously identified trigger event).

To avoid an error triggering of this kind, comparators with hysteresis must be used in the trigger system of an oscilloscope. In this context, the greater the background noise of the oscilloscope, the wider the hysteresis must be selected to be.

A triggering circuit, which reduces error triggering events through the use of comparators with hysteresis, is known from DE 10 2006 027 835 A1. As soon as the signal to be measured exceeds an upper hysteresis threshold, a timer is started. If the test signal does not fall below the lower hysteresis threshold within a fixed time span, a trigger pulse is output. If the lower hysteresis threshold is undercut before the time span of the timer has elapsed, no trigger signal is released.

The disadvantage with DE 10 2006 027 835 A1 is that the hysteresis thresholds cannot be adjusted arbitrarily so that test signals can still be safely triggered with different strengths of interference.

SUMMARY OF THE INVENTION

Accordingly, embodiments of the invention advantageously provide a device and a method for digital triggering of a test signal with superposed noise signals, which allow test signals with interference of different strengths to be triggered safely.

The measuring device according to embodiments of the invention for triggering a test signal with superposed noise signal provide a trigger unit, which is connected to a recording unit, wherein the test signal with respectively superposed noise signal is supplied to both, wherein the trigger unit outputs a trigger signal to the recording unit as soon as the test signal with superposed noise signal has completely run through a hysteresis range. Furthermore, the trigger unit is connected to a hysteresis adjustment unit, wherein the hysteresis adjustment unit specifies a hysteresis range of the trigger unit, and wherein the hysteresis range specified by the hysteresis adjustment unit is adjustable.

It is particularly advantageous if the hysteresis adjustment unit is connected directly to the trigger unit, because the trigger unit can then be adapted to test signals with different strengths of interference. According to the invention, this is achieved because a value for the hysteresis range can be selected arbitrarily and is specified to the hysteresis adjustment unit; in other words, it is adjustable. In this context, "adjustable" should be understood to mean, inter alia, that the value is continuously variable to a different value during the measurement of the hysteresis range. This means that the test signal to be displayed settles very quickly in spite of the superposed noise.

The method according to embodiments of the invention for triggering a test signal with superposed noise signal provide a trigger unit and a recording unit, which are connected to one another, wherein the test signal with respectively superposed noise is supplied to both. Moreover, the trigger unit is further connected to the hysteresis adjustment unit. In a first method step, parameters, such as the time range and/or level range, for example, the voltage range or the current range, are adjusted. In a second method step, the hysteresis range is adjusted for the trigger unit by the hysteresis adjustment unit, wherein the trigger unit outputs a trigger signal to the recording unit as soon as the test signal with superposed noise signal has completely run through the hysteresis range within the trigger unit.

In this context, it is particularly advantageous if the hysteresis range can be adjusted, because the hysteresis range can be adapted dynamically to an extremely diverse range of test signals during the measurement. Since the trigger signal is only output when the hysteresis range has been completely run through by the test signal, the probability of an accidental triggering can be reduced by selecting a relatively wider hysteresis range.

A further advantage of the measuring device according to embodiments of the invention is achieved if the hysteresis adjustment unit sets a time range within the trigger unit arbitrarily, wherein the trigger unit only outputs the trigger signal to the recording unit when a trigger threshold has been exceeded or undercut precisely once at the beginning of the time range. If the trigger threshold is exceeded or undercut several times within the time range, this indicates interference, which is superposed on the test signal and no trigger signal is output. This ensures that the trigger unit operates in an optimal manner even with interference of different frequency.

Moreover, with the measuring device according to embodiments of the invention, it is advantageous if the recording unit comprises a visualization unit, which is connected to the hysteresis adjustment unit and displays the set hysteresis range and/or the set time range. As a result, the triggering of the measuring device can be refined in a particularly simple manner in order to minimize error triggering events caused by interference.

Finally, with the measuring device according to embodiments of the invention, it is advantageous if the hysteresis range and/or the time range are adjustable in absolute values or in divisions (display segments). If the hysteresis range and/or the time range are adjusted in absolute values, it is possible to identify very quickly the magnitudes for the adjusted values at which the interference disappears, in order to infer the type of interference from this. However, the hysteresis range and/or the time range is also adjustable in divisions, so that the hysteresis range and/or the time range can be automatically scaled together with a scaling of the measuring device.

Additionally, with the method according to embodiments of the invention, it is advantageous if a time range is set by the hysteresis adjustment unit in the trigger unit, so that the trigger unit only outputs the trigger signal to the recording unit when a trigger threshold has been exceeded or undercut precisely once at the beginning of the time range. In addition to the adjustment of a hysteresis range, it is possible to adjust the trigger unit by varying the time range in such a manner that interference of different frequency no longer leads, as previously, to error triggering events.

Finally, with the method according to embodiments of the invention, it is advantageous if the trigger unit is a digital trigger unit and/or if the test signal with superposed noise signal is digitized. With the use of an analog trigger unit, this is built up from analog comparators. A hysteresis range can therefore be adjusted only by varying the resistors in the feedback path, which is again associated with additional noise. Accordingly, with the structure of a digital trigger unit, the hysteresis range can be adjusted without difficulty with bit-perfect accuracy. Moreover, the test signal is available in digitized form at the beginning, which once again considerably simplifies the further signal processing and means that a plurality of analog components can be dispensed with, which achieves a cost reduction and a less complex structure. At the same time, improved flexibility is achieved, because the digital signal processing can be rapidly adapted to other areas of application by modifying the program flow chart.

BRIEF DESCRIPTION OF THE DRAWINGS

By way of example, various exemplary embodiments of the invention are described with reference to the drawings. Identical subject matters provide the same reference numbers. In detail, the corresponding figures of the drawings are as follows.

DETAILED DESCRIPTION OF EXEMPLARY EMBODIMENTS OF THE INVENTION

Figure 1:
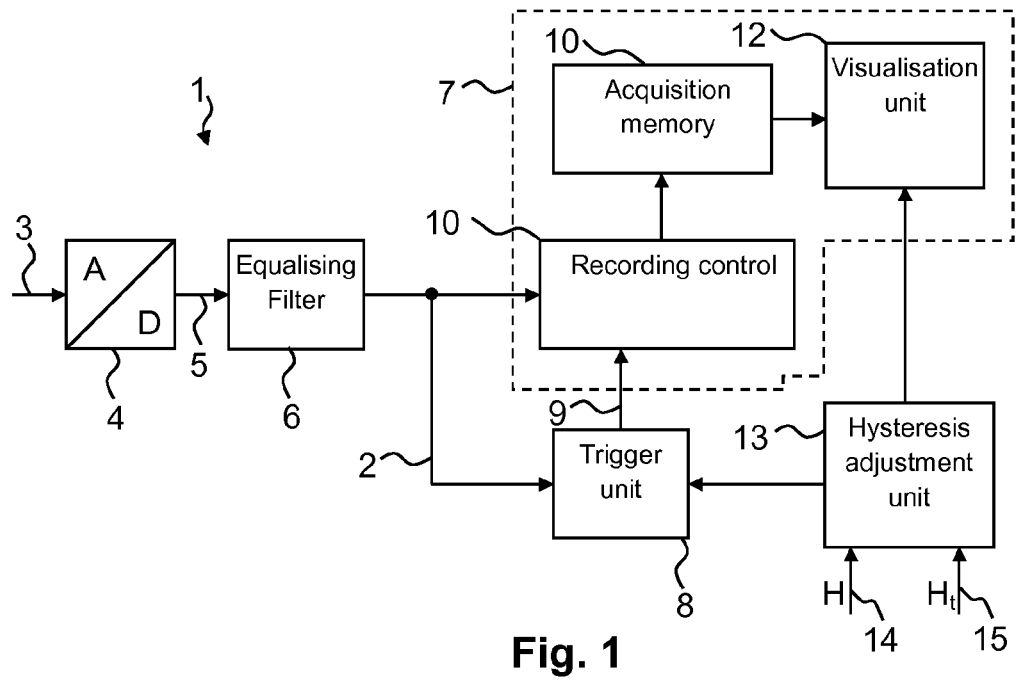
FIG. 1 shows a block-circuit diagram of an exemplary embodiment of the measuring device according to the invention for digital triggering of a recording of a test signal with superposed noise signal.

An exemplary embodiment according to the invention of the measuring device 1 for the digital triggering of a digitized test signal 2 with superposed noise signal is illustrated in FIG. 1 and will be described in greater detail below.

The analog test signal 3 with superposed noise is converted into its corresponding data format in an analog/digital converter 4. An equalizing of the linear or respectively nonlinear distorted digital test signal 5 is implemented in a downstream equalizing filter 6.

At the output of the equalizing filter 6, the test signal 2 with superposed noise signal is rerouted to the recording unit 7 and simultaneously to the trigger unit 8. Optionally, a decimation unit can also be introduced between the equalizing filter 6 and the recording unit 7, which compresses the test signal 2 with superposed noise signal at the output of the equalizing filter 6 by rerouting only every n-th sampled value of the test signal 2 with superposed noise signal to the recording unit 7. Accordingly, relatively long periods of time can be observed, although with reduced resolution, without needing to slow down the sampling frequency of the analog/digital converter 4.

In another exemplary embodiment according to the invention which is not illustrated, a further low-pass filter can be embodied between the equalizing filter 6 and the trigger unit 8. In particular, the higher frequency noise signal relative to the test signal 2 is band-limited in the low-pass filter. This reduces the variance of the noise signal.

However, with the use of a low-pass filter and a decimation unit, it can be stated that the signal at the output of the low-pass filter and at the output of the decimation unit is still the test signal 2 with a more or less strongly superposed noise, because the trigger unit 8 must necessarily trigger to the test signal 2. This also applies if further components are present between the analog test signal 3 and the digitized test signal 2 supplied to the trigger unit 8 and the recording unit 7.

In the trigger unit 8, the test signal 2 with superposed noise signal is compared with adjustable threshold values in order to generate a trigger signal 9. The trigger signal 9 is then rerouted to the recording unit 7 by connecting the trigger unit 8 to the recording unit 7 via a data connection.

The recording unit 7 provides a recording control 10, to which the test signal 2 with superposed noise signal is supplied from the equalizing filter 6 and the trigger signal 9 is supplied from the trigger unit 8. The recording control 10 also contains a ring buffer, which is not illustrated, in which the sampled values of the test signal 2 with superposed noise signal are stored.

Furthermore, the recording unit 7 provides an acquisition memory 11, which is connected to the recording control 10. As soon as the recording unit 7 receives the trigger signal 9 from the trigger unit 8, the corresponding sampled values of the test signal 2 with superposed noise signal are stored by the recording control 10 within the recording unit 7 in the acquisition memory 11 of the recording unit 7.

Moreover, the recording unit 7 also provides a visualization unit 12, which is connected to the acquisition memory 11. On a screen, which is not illustrated, the visualization unit 12 displays the sampled values of the test signal 2 with superposed noise signal selected by the recording control 10 within the recording unit 7.

The measuring device 1 further comprises a hysteresis adjustment unit 13, which is connected to the trigger unit 8 and the visualization unit 12 via a data connection. A value for the hysteresis range 30 to be adjusted within the trigger unit 8 is supplied to the hysteresis adjustment unit 13 from outside. This is illustrated via the data connection 14. Via the data connection 14, a user can specify a hysteresis range 30 to be set arbitrarily. The data connection 14 can also be connected to a further computer system which is not illustrated, so that an arbitrary hysteresis range 30 to be set is specified by the latter. The hysteresis range 30 set by the hysteresis adjustment unit 13 within the trigger unit 8 causes the digital comparators within the trigger unit 8, which compare the test signal 2 with superposed noise signal with a threshold value, to switch only when the hysteresis range 30 has been completely run through by the test signal 2 with superposed noise signal. The method of functioning of this factual situation will be described in greater detail with reference to the other drawings.

In this context, the hysteresis range 30 itself can be adjusted in absolute values, such as, mV, V or mA or A. A user or a computer system can specify a hysteresis range 30, for example of 1 mV, so that the test signal 2 with superposed noise signal must run through a range at the level of, for example, 1 mV below or above the trigger threshold 25 to the trigger threshold 25, so that the trigger unit 8 outputs the trigger signal. Of course, it is also possible to adjust the hysteresis range 30 in divisions instead of absolute values. In this manner, the set hysteresis range 30 is automatically matched with the scale set for the measuring unit, as soon as the scale is changed.

The hysteresis adjustment unit 13 is then also provided with an arbitrary time range 60 via a second connection 15. This time range 60 can also be specified by a user, which is not illustrated, or by a computer system which is also not illustrated. The hysteresis adjustment unit 13 further sets the time range 60 within the trigger unit 8 corresponding to the request from the user or the instruction from the computer system. This means that the trigger unit 8 only outputs a trigger signal 9 when the trigger threshold 25 is exceeded or undercut only once at the beginning of the time range 60. If the trigger threshold 25 is exceeded or undercut more than once within the time range 60, no trigger signal 9 is output. On one hand, the time range 60 can also be adjusted in absolute values, such as ns, ms or s. On the other hand, it is also possible to specify this in divisions, so that, in the case of a change of the time scale, the time range 60 is changed in an equivalent manner. The manner of functioning of the time range 60 will be explained in greater detail with regard to the other drawings.

Figure 2:
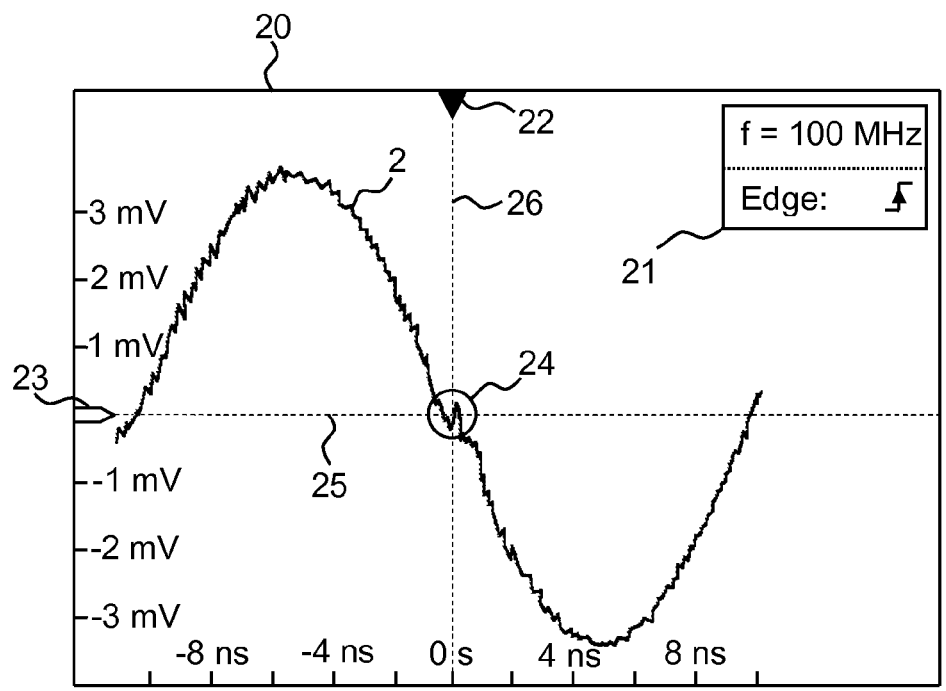
FIG. 2 shows a screenshot from an exemplary embodiment of a measuring device without the triggering unit according to the invention with an erroneously released triggering.

FIG. 2 shows a screenshot 20 of an exemplary embodiment of the measuring device 1 without the trigger unit 8 with an erroneously released triggering. The screenshot 20 shows a very simplified screen display of the measuring unit 1, which the user sees when operating, for example, the oscilloscope. The test signal 2 with superposed noise signal is shown. The test signal 2 has a frequency, for example, of approximately 100 MHz and an amplitude of somewhat above 3 mV. The status display 21 shows that the triggering is to be released on a rising signal edge of the test signal 2. The triggering time 26 is visualized by the cursor 22 and is disposed at 0 s. The trigger 23 itself is set to a trigger threshold 29 of 0 mV. It is evident that the trigger unit 8 is triggered even though the test signal 2 shows a falling signal edge. This is because the noise at the level of the trigger threshold 25 is superposed on the test signal 2 in such a manner that a rising signal edge 24 occurs for a short time.

In fact, the use of a low-pass filter reduces this high-frequency interference, but, on the other hand, also ensures that the actual test signal 2 can be attenuated. If a display of several signals is required, which are to be supplied, for example, to the oscilloscope, via different channels, wherein the trigger is supposed to be released in response to a signal, the phase response of the low-pass filter can ensure that the signals are not displayed in phase with one another thereby falsifying the measurement. If the trigger unit 8 is set to automatic by a single triggering (manual), as shown in FIG. 2, so-called shadows appear as a result of the more or less periodic occurrence of this interference, that is, a rapid alternation of the images displayed in the case of a correctly released trigger and an incorrectly released trigger. The user receives the impression that two test signals, which are phase-displaced by 180° relative to one another, have been measured at the same time, so that the evaluation of the actual test signal 2 is no longer possible.

Figure 3:
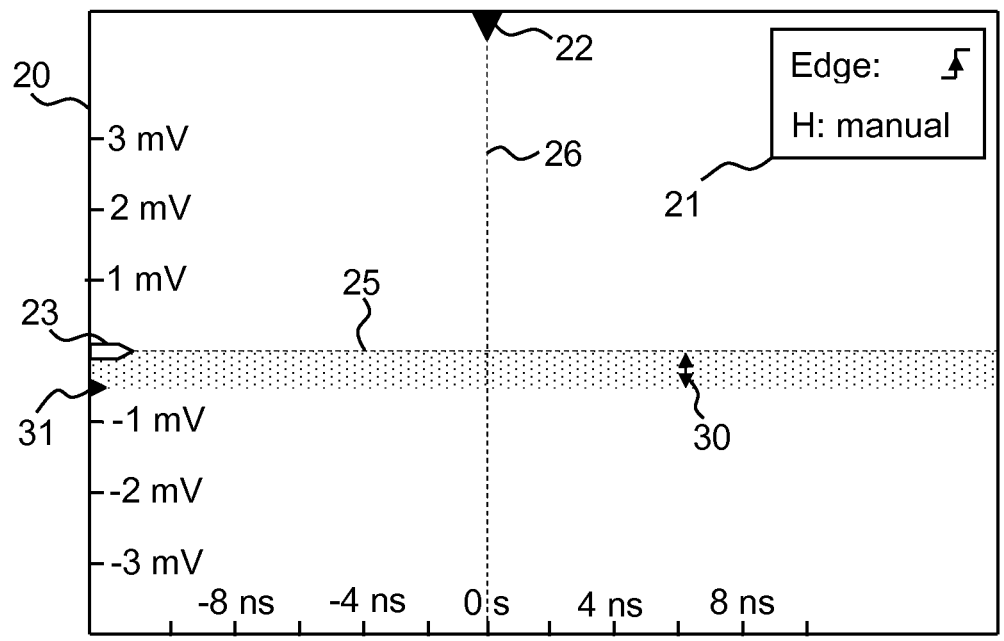
FIG. 3 shows a screenshot of an exemplary embodiment of the measuring device according to the invention with activated hysteresis range.

FIG. 3 shows a screenshot 20 of an exemplary embodiment of the measuring device 1 according to the invention with activated hysteresis range 30. It is evident that alongside the cursor 22, which determines the triggering time 26, and the cursor 23 for the trigger, another small cursor 31 is provided, which can be moved downwards away from the cursor 23. The area between the trigger threshold 25 and the further cursor 31 symbolises the set hysteresis range 30 in the digital comparators of the trigger unit 8. With the use of a digital trigger unit 8, different values for the hysteresis range 30 can be adjusted. By preference, as many values for the hysteresis range 30 are adjustable as the resolution of the comparators allows. In this context, it is possible to speak of a bit-perfect adjustment of the hysteresis range 31. On the other hand, it is also possible to select the hysteresis range 30 from one of various pre-set values. For example, values are stored for a small, medium and large hysteresis range 30, which can be selected directly via corresponding operating buttons on the housing of the measuring device 1, thereby speeding up the adjustment of the measuring device 1. Another possibility is the automatic selection of the correct hysteresis range 30 by the measuring device 1 itself.

It is particularly advantageous that the visualization unit 12 is connected to the hysteresis adjustment unit 13 and that the set hysteresis range 30 is transmitted to the visualization unit 12 via this data connection, which displays the latter to the user on a screen unit, which is not illustrated. By preference, the set hysteresis range 30 is displayed by the visualization unit 12 through a colored and/or transparent area below or above the trigger threshold 25, dependent upon whether the triggering is to take place on a rising or falling signal edge. The displacement of the further cursor 31 for the hysteresis range 30 can be implemented during the registration of the test signal 2. By preference, the hysteresis range 30 can be matched via a rotary button during the course of measurements.

Accordingly, operation is intuitive, because both the test signal 2 and also the hysteresis range 30 are displayed on the screen unit by the visualization unit 12. As soon as no shadows occur with a triggering, the hysteresis range 30 has been selected correctly. The area which corresponds to the hysteresis range 30 is preferably displayed in a color, which is not allocated to any of the existing measurement channels. To ensure that the test signal 2 is still readily perceived, the hysteresis range 30 should be displayed transparently with a relatively low contrast.

Figure 4A:
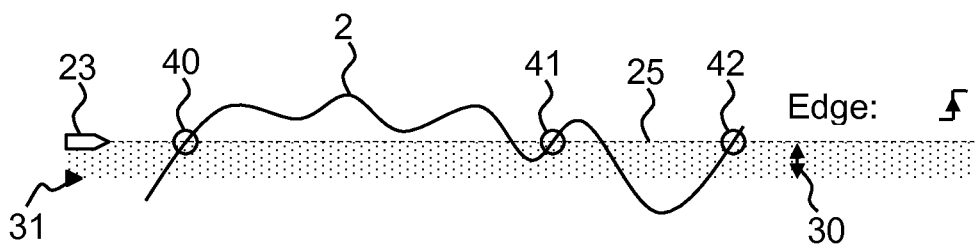
FIG. 4A shows a screenshot of an exemplary embodiment, which explains the method of functioning of the measuring device according to the invention with activated hysteresis range in the case of a rising edge.

FIG. 4A shows a part of the screenshot 20 of an exemplary embodiment, which explains the method of functioning of the measuring device 1 according to the invention with activated hysteresis range 30 in the case of a triggering on a rising signal edge. The test signal 2 with superposed noise, which exceeds the trigger threshold 25 with a positive gradient at several positions 40, 41 and 42 is illustrated. At position 40, the trigger unit 8 outputs a trigger signal 9, because the test signal 2 has completely run through the hysteresis range 30. In this context, "completely run through" is understood to mean that the test signal 2 must run through the range from the further cursor 31 to the trigger threshold 25. Accordingly, at position 41, no trigger signal 9 is output by the trigger unit 8, because the hysteresis range 30 has not been completely run through. It is clearly evident that the trigger unit 8 becomes less sensitive, the larger the hysteresis range 30 is selected to be. If a test signal 2 has strong superposed noise, a safe triggering of the trigger unit 8 is still guaranteed if a sufficiently large hysteresis range 30 is selected. A trigger signal 9 is once again output by the trigger unit 8 at position 42, because the hysteresis range 30 has been completely run through by the test signal 2.

Figure 4B:
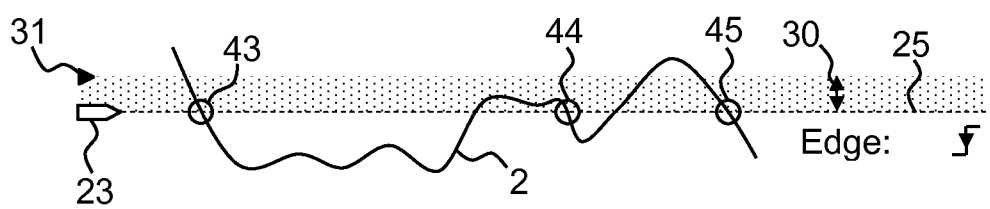
FIG. 4B shows a screenshot of an exemplary embodiment which explains the method of functioning of the measuring device according to the invention with activated hysteresis range in the case of a falling edge.

FIG. 4B shows a part of the screenshot 20 of an exemplary embodiment which explains the method of functioning of the measuring device 1 according to the invention with activated hysteresis range 30 in the case of a triggering on a falling signal edge. The difference between the triggering on a rising signal edge, as shown in FIG. 4A, and the triggering on a falling signal edge of the test signal 2, as shown in FIG. 4B, consists in the direction in which the area which symbolises the hysteresis range 30, is orientated. In the case of a triggering on a falling signal edge, the further cursor 31 for the adjustment of the hysteresis range 30 is disposed above the cursor 23 for the adjustment of the trigger threshold 25. By analogy with FIG. 4A, according to FIG. 4B, a trigger signal 9 is output by the trigger unit 8 at positions 43 and 45, because the hysteresis range has been completely run through. At position 44, no trigger signal 8 is output, precisely because the hysteresis range 30 has not been run through completely.

As soon as the user changes the signal edge on which the triggering is to be implemented, the further cursor 31 at the trigger threshold 25, which extends horizontally along the cursor 23 for the trigger, is mirrored. Accordingly, it is not necessary for the hysteresis range 30 to be re-set every time the signal edge on which the triggering is implemented is changed.

Figure 5:
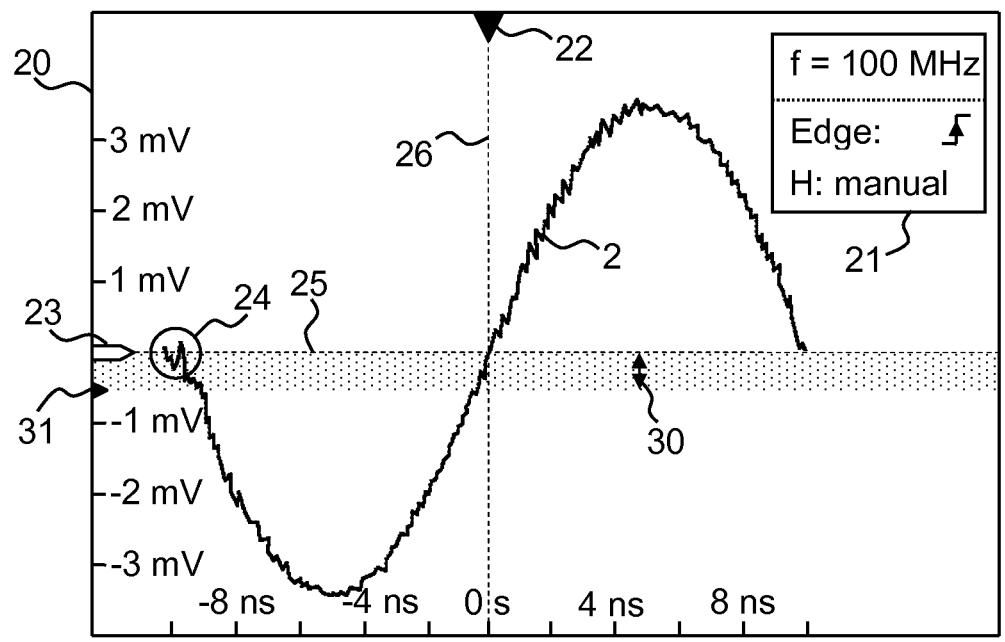
FIG. 5 shows a screenshot of an exemplary embodiment of the measuring device according to the invention with activated hysteresis range and correctly released trigger.

FIG. 5 shows a screenshot 20 of an exemplary embodiment of the measuring device 1 according to the invention with activated hysteresis range 30 and trigger released in an error-free manner. The screenshot 20 from FIG. 5 shows the same test signal 2 as illustrated in FIG. 2. The difference is that in FIG. 5, the hysteresis range 30 is activated within the digital trigger unit 8 (H: manual), as shown by the status display 21. The test signal 2 at position 24, which has still released an error triggering in FIG. 2, no longer completely runs through the hysteresis range 30 in FIG. 5, as described in FIGS. 4A and 4B, so that the trigger unit 8 no longer outputs a trigger signal for position 24. Accordingly, the test signal 2 is correctly registered.

Figure 6:
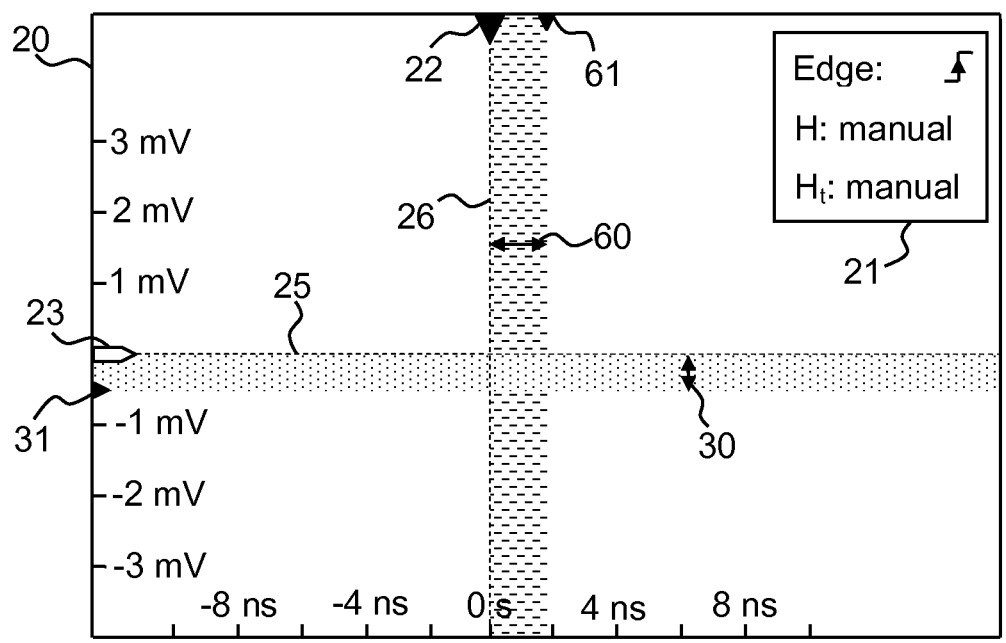
FIG. 6 shows a screenshot of an exemplary embodiment of the measuring device according to the invention with activated hysteresis range and activated time range.

FIG. 6 shows a screenshot 20 of an exemplary embodiment of the measuring device 1 according to the invention with activated hysteresis range 30 (H: manual) and activated time range 60 ($H_t$: manual). Reference is made to the preceding description for an explanation of the hysteresis range 30. In addition to the cursor 22 for the trigger time 26, the further cursor 31 for the hysteresis range 30 and the cursor 23 for the trigger with the trigger threshold 25, there is another, fourth cursor 61 for the time range 60. The cursor 61 for the time range 60 is embodied on the positive time axis alongside the cursor 22 for the trigger time 26. The difference between the cursor 61 for the time range 60 and the cursor 22 for the trigger time 26 is also referred to as the time range 60. The adjusted time range 60 in this context is visualized by the visualization unit 12. By preference, the time range 60 in this context is displayed by a colored and/or transparent area on the positive time axis alongside the trigger time 26. Accordingly, the area for the time range 60 is preferably displayed in a different color and/or with reduced contrast by comparison with the colors allocated to the measurement channels within, for example, an oscilloscope.

The time range 60, like the hysteresis range 30 of the hysteresis adjustment unit 13, is also specified by the user or by a connected computer system, and the hysteresis adjustment unit 13 then sets this in the trigger unit 8 and reroutes it to the visualization unit 12. Accordingly, different values for the time range 60 can be adjusted. By preference, the time range 60 can be set arbitrarily, wherein "arbitrarily" is understood to mean that the time range 60 must be positive, and the cursor 61 for the time range 60 is not adjustable in steps which are smaller than the sampling rate of the analog/digital converter 4. It can also be stated that the time range 60 is adjustable in very fine steps. It is, of course, also possible to select the time range 60 from various pre-set values. For example, there can be values, for example, for 1 ns, 10 ns, 100 ns and so on, which can be adjusted directly via operating buttons, for example, on the oscilloscope in order to avoid more time intensive and in many cases unnecessary entries of a specific value for the time range 60.

The set time range 60 causes the trigger unit 8 only to output the trigger signal 9 to the recording unit 7 when the trigger threshold 25 has been exceeded or undercut precisely once at the trigger time 26 at the beginning of the time range 60. In this context, as shown in FIG. 6, the time range can be adjusted in absolute values. It is also possible to adjust the time range 60 in divisions, so that the time range 60 varies uniformly, when the scale is reset. If a division corresponds, for example, to a time duration of 1 ns, and if the time range 60 is set to a division, the time range 60 then also corresponds to a time duration of 1 ns beginning from the trigger time 26. Now, if the time scale is changed, so that a division now corresponds to 10 ns, the time range 60 will extend 10 ns along the positive time axis, viewed from the trigger time 26. Furthermore, it is possible to mask the time range 60 after it has been adjusted. In this case, the value for the adjusted time range 60 can optionally be visualized in the status display 21. The same also applies for the hysteresis range 30.

FIGS. 7A, 7B, 7C and 7D explain in detail the method of functioning of the trigger unit 8 according to the invention with activated hysteresis range 30 and activated time range 60 in the case of a triggering on a rising or falling signal edge of the test signal 2.

Figure 7A:
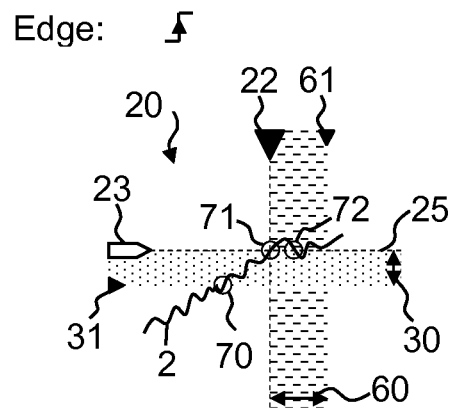
FIG. 7A shows a screenshot of an exemplary embodiment, which explains the method of functioning of the measuring device according to the invention with activated hysteresis range and activated time range in the case of a rising edge.

In FIG. 7A, the trigger unit 8 is set in such a manner that it should output a trigger signal 9 as soon as a test signal 2 with superposed noise has run completely through the hysteresis range 30 and exceeds the level specified by the cursor 23 for the trigger threshold 25 and remains within the time range 60 above the trigger threshold 25. It is evident that, at time 70, the test signal 2 enters the hysteresis range 30 and has completely passed through this range at time 71, upon reaching the trigger threshold 25. If no time range 60 had been specified, the trigger unit 8 would output a trigger signal 9 to the recording unit 7 at time 71. However, in FIG. 7A, a time range 60 was set by the user. Because the test signal 2 undercuts the trigger threshold 25 at time 72, and because time 72 is still disposed within the time range 60, no trigger signal 9 is output by the trigger unit 8.

Figure 7B:
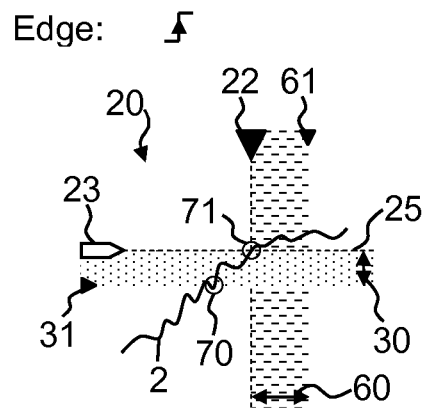
FIG. 7B shows a further screenshot of an exemplary embodiment, which explains the method of functioning of the measuring device according to the invention with activated hysteresis range in the case of a rising edge.

FIG. 7B shows an exemplary embodiment with a screenshot 20 which is based upon the same settings of the trigger unit 8 according to the invention as the screenshot 20 from FIG. 7A, for which reason reference is made to the description for FIG. 7A. In FIG. 7B, the test signal enters the hysteresis range 30 at time 70 and has completely run through the hysteresis range 30 upon reaching the trigger threshold 25 at time 71. Following this, the test signal 2 does not undercut the trigger threshold 25 again during the time range 60, so that, at the end of the time range 60, the trigger unit 8 outputs the trigger signal 9 to the recording unit 7.

Figure 7C:
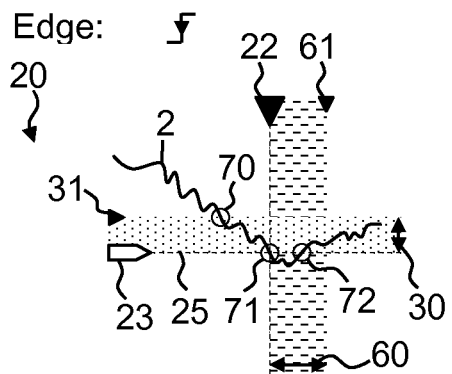
FIG. 7C shows a screenshot of an exemplary embodiment, which explains the method of functioning of the measuring device according to the invention with activated hysteresis range in the case of a falling edge.
Figure 7D:
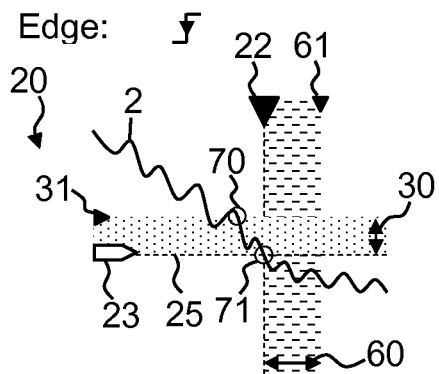
FIG. 7D shows a further screenshot of an exemplary embodiment, which explains the method of functioning of the measuring device according to the invention with activated hysteresis range in the case of a falling edge.

FIGS. 7C and 7D explain the same factual situation as FIGS. 7A and 7B with the exception that the trigger unit 8 is set in such a manner that, instead of triggering on a rising signal edge of the test signal 2, it triggers on a falling signal edge of the test signal 2. Accordingly, coming from a high level, the test signal 2 enters the hysteresis range 30 at time 70 and has completely run through or passed through the hysteresis range 30 upon reaching the trigger threshold 25 at time 71. If the user had not set a time range 60, the trigger unit 8 would output a trigger signal 9 to the recording unit 7. However, it is evident that the test signal 2 passes through or exceeds the trigger threshold 25 again within the time range 60 at time 72, so that the trigger unit 8 therefore does not output a trigger signal 9.

FIG. 7D shows an exemplary embodiment with a screenshot 20, which is based on the same settings of the trigger unit 8 according to the invention as the screenshot 20 from FIG. 7C. In FIG. 7D, the test signal 2 enters the hysteresis range 30 at time 70 and has completely run through the hysteresis range 30 upon reaching the trigger threshold 25 at time 71. Following this, the test signal 2 does not exceed the trigger threshold 25 again during the time range 60, so that, at the end of the time range 60, the trigger unit 8 outputs the trigger signal 9 to the recording unit 7.

Figure 8:
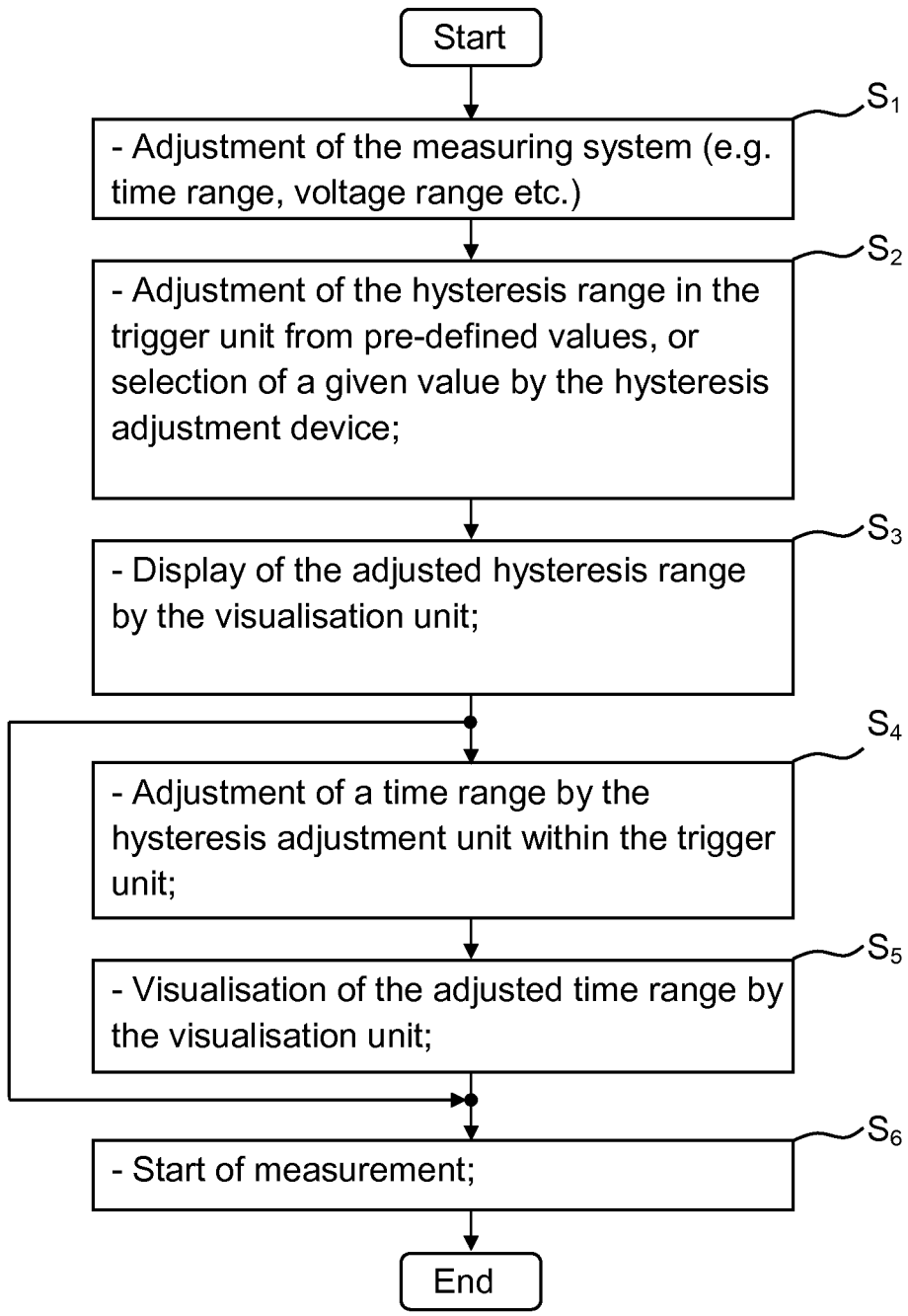
FIG. 8 shows an exemplary flowchart, which describes the method according to the invention for the measuring device.

FIG. 8 shows an exemplary flowchart which describes the method according to the invention for the measuring device 1. In a first method step $S_1$, the measuring device, which is, for example, an oscilloscope, is adjusted according to the anticipated test signal to be measured. This is implemented by a user or by a computer system connected to the measuring device. In this context, general parameters, such as the time range and/or the level range, for example, the voltage range or current range, and/or the trigger threshold 25 and/or the trigger time 26 and/or the signal edge on which the trigger unit 8 triggers and/or the channel to be measured and/or the terminal resistance at the test input, are adjusted.

In a second method step $S_2$, the hysteresis range 30 is set within the trigger unit 8 by the hysteresis adjustment unit 13. Accordingly, different values for the hysteresis range 30 can be set by a user or by a computer system connected to the measuring device 1. By preference, the hysteresis range 30 can be adjusted arbitrarily, wherein this wording should be understood particularly in the sense that the hysteresis range 30 can extend over the entire triggering range of the digital comparator. If the digital comparator provides a resolution, for example, of 12 bits, the hysteresis range 30 can be set to a maximum of precisely $2^{12}$ steps. In view of the fact that it has not hitherto been possible within the prior art to set the hysteresis range 30, it can therefore be stated that the hysteresis range 30 is arbitrarily adjustable, taking into consideration what is required for a sufficiently accurate measurement. In other words, the hysteresis range 30 can be adjusted maximally, corresponding to the accuracy of the digital comparators within the trigger unit 8.

As soon as the test signal 2 with superposed noise signal has completely run through the adjusted hysteresis range 30 within the trigger unit 8, the trigger unit 8 outputs a trigger signal 9 to the recording unit 7. The wording "completely run through" should be understood to mean that the test signal 2 with superposed noise signal must run through the hysteresis range 30 beginning with the hysteresis range 30 most remote from the trigger threshold 25 through to the trigger threshold 25. In other words, the test signal with superposed noise signal must run through the hysteresis range 30 completely in the direction towards the trigger threshold 25 or until it reaches the trigger threshold 25, so that the trigger unit 8 outputs a trigger signal 9 to the recording unit 7. In this context, the hysteresis range 30 can be adjusted in absolute values, such as 1 mV, 2 mV, 3 mV, or in divisions such as 0.5 div, 1 div, and so on.

In a third method step $S_3$, the visualization unit 12 in the recording unit 7, which is connected to the hysteresis adjustment unit 13, displays the hysteresis range 30 set by the user or a computer system on a screen. In this context, the set hysteresis range 30 is displayed by the visualization unit 12 by a colored and/or transparent area below or above the trigger threshold 25. Automatic masking of the hysteresis range 30 after a pre-set time duration or a similarly adjustable time duration is also possible, as is the display of the value for the hysteresis range 30 in the status display 21.

Accordingly, the hysteresis range 30 can also be selected from one of various pre-set values. For example, values for a small, medium and large hysteresis range 30 can be allocated directly to operating buttons on the measuring device 1 in order to achieve as rapid an adjustment as possible. An automatic determination of the hysteresis range 30 is also possible in this context. After the third method step $S_3$, the sixth method step $S_6$, in which the measurement is started, can be performed directly.

Optionally, after the third method step $S_3$, a fourth method step $S_4$ can be implemented. In this fourth method step $S_4$, a time range 60 is set within the trigger unit 8 by the hysteresis adjustment unit 13. Accordingly, different values can be adjusted for the time range 60 by a user or by a computer system connected to the measuring device 1. By preference, the time range 60 is arbitrarily adjustable, wherein this should be understood to mean that the time range 30 can be adjusted in steps, which are as small as a reciprocal part of the frequency, with which the test signal 2 with superposed noise signal is sampled by the analog/digital converter 4. In other words, the adjustment of the time range 60 within the hysteresis adjustment unit 13 is implemented in steps which are as small as the reciprocal part of the frequency, with which the test signal 2 with superposed noise signal is sampled by the analog/digital converter. This can also be described as an adjustment of the time range 60 with bit-perfect accuracy. Following this, a trigger signal 9 is only output by the trigger unit 8 to the recording unit 7, when the trigger threshold is exceeded or undercut precisely once at the beginning of the time range 60 by the test signal 2 with superposed noise signal. The wording at the beginning of the time range 26 is equivalent to the wording at the trigger time 26.

In this context, the time range can be adjusted in absolute values, for example, 1 ns, 2 ns and so on, or also in divisions, such as 0.5 div, 1 div and so on. The time range 60 can also be selected from one of various pre-set values, which are preferably directly allocated to an operating button, in order to achieve as fast an adjustment of the measuring device 1 as possible. An automatic determination of the time range 60 by the measuring device 1 itself can also be set.

In a fifth method step $S_5$, the set time range 60 is displayed by the visualization unit 12 on the screen for the user. By preference, the set time range 60 in this context is displayed by the visualization unit 12 with a colored and/or transparent area adjacent to the trigger time 26 along the positive time axis. Automatic masking of the time range 60 after a pre-set time duration or similarly adjustable time duration is also possible, as is the display of the value for the time range 60 in the status display 21.

After the completion of the fifth method step $S_5$, the sixth method step $S_6$, which has already been explained, is implemented. It should be emphasised that it is particularly advantageous if the trigger unit 8 is a digital trigger unit 8 and/or if the test signal 2 with superposed noise signal is digitized, because otherwise the hysteresis range 30 would have to be adjusted via a resistance network in the analog comparators, which does not permit such a fine adjustment, as with the use of digital comparators and also increases the noise.

It is also important that the time range 60 can be activated when the hysteresis range 30 is de-activated, wherein, with an activated time range 60 and activated hysteresis range 30, the test signal 2 with superposed noise can be significantly better triggered, and an error triggering of the trigger unit 8 is further reduced as a result.

The measuring device 1, which is, in particular, a digital-memory oscilloscope, can be adjusted and controlled either by a user or by a computer system connected to the measuring device 1. In the latter case, the measuring device 1 is connected to the computer system via an LAN interface (local area network) and/or USB interface (universal serial bus) and/or an GPIB Interface (general purpose interface bus), wherein the instructions for controlling the measuring device 1 are preferably coded as SCPI commands (standard commands for programmable instruments).

Within the framework of the invention, all of the features described and/or illustrated can be combined with one another as required. The triggering can also be used with measuring device other than an oscilloscope.

The invention claimed is:

1. A measuring device for triggering a test signal with superposed noise signal, comprising a trigger unit, which is connected to a recording unit, wherein the test signal with respectively superposed noise signal is supplied to the trigger unit and the recording unit, wherein the trigger unit is embodied to output a trigger signal to the recording unit as soon as the test signal with superposed noise signal has run completely through a hysteresis range,
wherein the trigger unit is connected to a hysteresis adjustment unit,
wherein the hysteresis adjustment unit specifies a hysteresis range of the trigger unit,
wherein the hysteresis range specified by the hysteresis adjustment unit is adjustable with bit-perfect accuracy corresponding to an accuracy of the digital comparators,
wherein the recording unit provides a visualization unit, which is connected to the hysteresis adjustment unit, and
wherein a set hysteresis range is displayed by the visualization unit by a transparent area with a low contrast below or above a trigger threshold in a color which is not allocated to any existing measurement channel.

2. The measuring device according to claim 1,
wherein the hysteresis adjustment unit sets a time range arbitrarily within the trigger unit, and
wherein the trigger unit is embodied to output the trigger signal only to the recording unit when a trigger threshold has been exceeded or undercut precisely once at the beginning of the time range.

3. The measuring device according to claim 2,
wherein the trigger unit is a digital trigger unit and/or that the test signal with superposed noise signal is digitized.

4. The measuring device according to claim 2,
wherein the recording unit provides a visualization unit, which is connected to the hysteresis adjustment unit and displays the set hysteresis range and/or the set time range.

5. The measuring device according to claim 2,
wherein the hysteresis range and/or the time range can be adjusted in absolute values or in divisions.

6. The measuring device according to claim 1,
wherein the trigger unit is a digital trigger unit and/or that the test signal with superposed noise signal is digitized.

7. The measuring device according to claim 6,
wherein different values can be adjusted for the hysteresis range and/or for the time range, and/or that the hysteresis range and/or the time range can be adjusted in the hysteresis adjustment unit with bit-perfect accuracy and/or that the hysteresis range and/or the time range can be selected from one of various pre-set values.

8. The measuring device according to claim 7,
wherein the recording unit provides a visualization unit, which is connected to the hysteresis adjustment unit and displays the set hysteresis range and/or the set time range.

9. The measuring device according to claim 8,
wherein the hysteresis range and/or the time range can be adjusted in absolute values or in divisions.

10. The measuring device according to claim 7,
wherein the hysteresis range and/or the time range can be adjusted in absolute values or in divisions.

11. The measuring device according claim 1,
wherein the recording unit provides a visualization unit, which is connected to the hysteresis adjustment unit and displays the set hysteresis range and/or the set time range.

12. The measuring device according to claim 11,
wherein the set hysteresis range is displayed by the visualization unit by a colored and/or transparent area below or above the trigger threshold, and/or that the set time range is displayed by the visualization unit by a colored and/or transparent area laterally adjacent to the trigger time.

13. The measuring device according to claim 12,
wherein the hysteresis range and/or the time range can be adjusted in absolute values or in divisions.

14. The measuring device according to claim 1,
wherein the hysteresis range and/or the time range can be adjusted in absolute values or in divisions.

15. A method for triggering a test signal with superposed noise signal, comprising a trigger unit, which is connected to a recording unit, wherein the test signal with respectively superposed noise signal is supplied to the trigger unit and the recording unit and, wherein a hysteresis adjustment unit is connected to the trigger unit, and
wherein the recording unit provides a visualization unit which is connected to the hysteresis unit,
with the following method steps:
adjusting parameters, especially time range and/or level range;
bit-perfect adjusting of a hysteresis range corresponding to an accuracy of the digital comparators for the trigger unit by the hysteresis adjustment unit, wherein the trigger unit outputs a trigger signal to the recording unit as soon as the test signal with superposed noise signal has run completely through the hysteresis range within the trigger unit; and
displaying of a set hysteresis range by the visualization unit by a transparent area with a low contrast below or above a trigger threshold in a color which is not allocated to any existing measurement channel.

16. The method according to claim 15,
wherein the method further comprises the following method step:
adjusting of a time range within the trigger unit by the hysteresis adjustment unit, wherein the adjustment of the time range is implemented arbitrarily within the hysteresis adjustment unit, and wherein the trigger unit outputs the trigger signal to the recording unit only when a trigger threshold has been exceeded or undercut precisely once at the beginning of the time range.

17. The method according to claim 16,
wherein the method further comprises the following method step:
displaying of the set time range by the visualization unit.

18. The method according to any claim 17,
wherein the trigger unit is a digital trigger unit, and/or that the test signal with superposed noise signal is digitized.

19. The method according to claim 16,
wherein the trigger unit is a digital trigger unit, and/or that the test signal with superposed noise signal is digitized.

20. The method according to claim 15,
wherein the trigger unit is a digital trigger unit, and/or that the test signal with superposed noise signal is digitized.

* * * * *